(12) United States Patent
Imamura et al.

(10) Patent No.: US 7,420,189 B2
(45) Date of Patent: Sep. 2, 2008

(54) ULTRA PRECISE POLISHING METHOD AND ULTRA PRECISE POLISHING APPARATUS

(75) Inventors: Tomonori Imamura, Tokyo (JP); Isao Yamada, 11-9, Shinzaikehonmachi 6-chome, Himeji-shi, Hyogo 670-0092 (JP); Noriaki Toyoda, 205, 3-6, Higashitsujii 1-chome, Himeji-shi, Hyogo 670-0084 (JP)

(73) Assignees: Olympus Corporation, Tokyo (JP); Isao Yamada, Hyogo (JP); Noriaki Toyoda, Hyogo (JP)

( * ) Notice: Subject to any disclaimer, the term of this patent is extended or adjusted under 35 U.S.C. 154(b) by 214 days.

(21) Appl. No.: 11/397,140

(22) Filed: Apr. 4, 2006

(65) Prior Publication Data

US 2007/0227879 A1   Oct. 4, 2007

(51) Int. Cl.
*G21K 5/10* (2006.01)

(52) U.S. Cl. .............. 250/492.21; 250/492.1; 250/492.3; 216/63; 216/66

(58) Field of Classification Search .............. 250/492.1, 250/492.21, 492.3; 257/E21.482, E21.483; 216/63, 66
See application file for complete search history.

(56) References Cited

U.S. PATENT DOCUMENTS

| | | | | |
|---|---|---|---|---|
| 5,868,952 | A * | 2/1999 | Hatakeyama et al. | 216/66 |
| 6,130,507 | A * | 10/2000 | Maishev et al. | 315/111.81 |
| 6,486,478 | B1 * | 11/2002 | Libby et al. | 250/492.1 |
| 6,646,277 | B2 * | 11/2003 | Mack et al. | 250/492.21 |
| 6,750,460 | B2 * | 6/2004 | Greer | 250/492.2 |
| 2003/0080088 | A1 * | 5/2003 | Kagami et al. | 216/41 |
| 2005/0003742 | A1 * | 1/2005 | Miyazawa | 451/41 |
| 2006/0102854 | A1 * | 5/2006 | Neogi et al. | 250/492.1 |

FOREIGN PATENT DOCUMENTS

| | | |
|---|---|---|
| JP | 08-120470 | 5/1996 |
| JP | 2003-217102 | 7/2003 |
| JP | 2004-291209 | 10/2004 |
| JP | 2004-310067 | 11/2004 |

OTHER PUBLICATIONS

Bischoff, et al. "Focused ion beam sputtering investigations on SiC" Applied Surface Science 184 (2001) 372-376.*

* cited by examiner

*Primary Examiner*—Jack I. Berman
*Assistant Examiner*—Michael Maskell
(74) *Attorney, Agent, or Firm*—Hogan & Hartson LLP

(57) ABSTRACT

An ultra precise polishing method includes controlling an irradiation time of a surface position of an object to be processed irradiated by a gas cluster ion beam. A profile is created and polished on the surface of the object to be processed by controlling irradiation of the gas cluster ion beam. An ultra precise polishing apparatus includes an irradiating device for irradiating a surface of an object to be processed by a gas cluster ion beam. A positioning device is provided for changing a surface position of the object to be processed, which is irradiated by the gas cluster ion beam by moving the irradiating device and the object to be processed relative to each other. A control device is provided for controlling the irradiation time of a surface position of the object to be processed irradiated by the gas cluster ion beam.

2 Claims, 11 Drawing Sheets

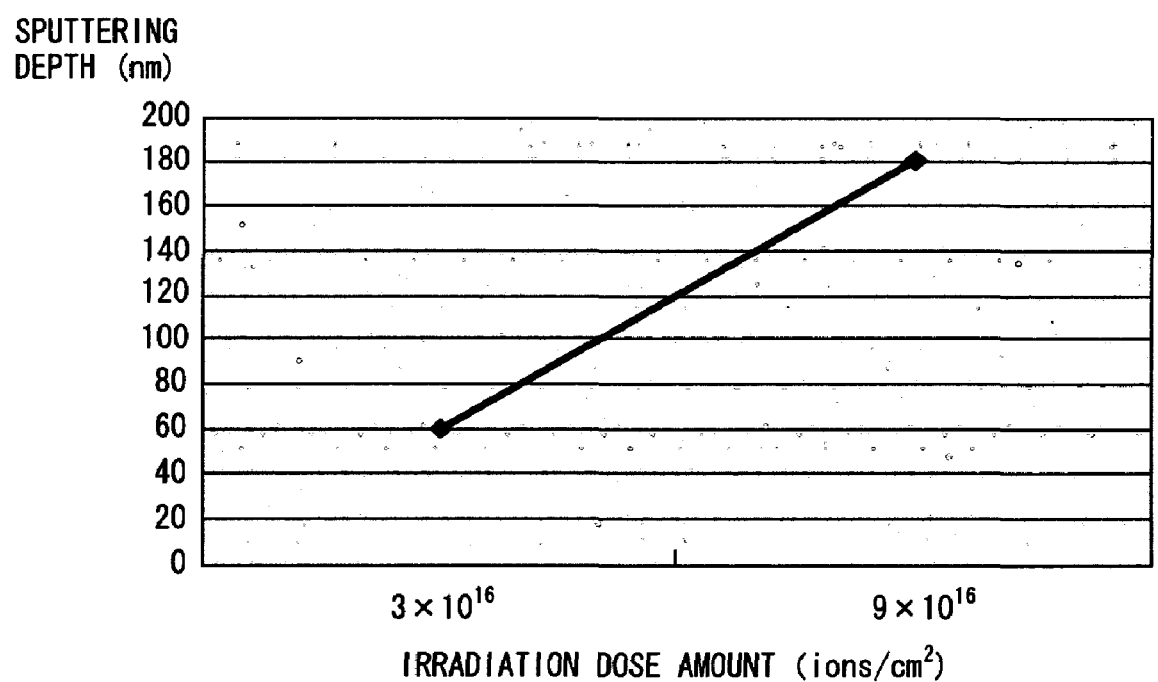
F I G. 6

ULTRA PRECISE POLISHING METHOD AND ULTRA PRECISE POLISHING APPARATUS

CROSS REFERENCE TO RELATED APPLICATION

The application claims benefit of Japanese Application No. 2003-353562 filed on Oct. 14, 2003, the contents of which are incorporated by this reference.

BACKGROUND OF THE INVENTION

1. Field of the Invention

The present invention relates to an ultra precise polishing method and an ultra precise polishing apparatus used for polishing a workpiece surface.

2. Description of the Related Art

In optical glass components such as a lens, there are a spherical lens and an aspheric lens, which are rotationally axisymmetric, and a free formed lens, which is rotationally nonaxisymmetric, etc., and press molding using a molding die serves as a leading processing means for mass-production of these lenses. In this case, if the forms of the lenses press-molded by a molding die are not precise, a function as an optical instrument deteriorates for aberration is produced in optical instruments such as a camera in which the lens is incorporated. When the surface roughness of the molding die is rough, the surface roughness of the molded lens also becomes rough surface, generating a flare in the optical instrument. Thus, although processing precision of a lens is important in press molding of the lens, what influences the processing precision of the lens is form precision of the surface of the molding die imprinted on the lens.

Laid-open Japanese Patent Application No. H8-120470 describes a method for ultra precise polishing of a surface of a workpiece such as a molding die by irradiation with a gas cluster ion beam. When the gas cluster of the ion beam is split by the collision with the workpiece caused by irradiation of the workpiece, multi-body collision occurs between cluster component atoms or molecules and workpiece component atoms or molecules, and motion in a horizontal direction with respect to the workpiece surface is intensified. As a result, the convexity of the workpiece surface is largely smoothened, and ultra precise polishing producing evenness on an atomic scale can be achieved.

SUMMARY OF THE INVENTION

The ultra precise polishing method, which is one aspect of the present invention, is a method for controlling an irradiation time, for which a surface position of a processed object is irradiated by a gas cluster ion beam, and creating and polishing a profile on the surface of the processed object by controlling irradiation of the gas cluster ion beam.

The ultra precise polishing method, which is another aspect of the present invention, is a method for calculating an irradiation time of a surface position of the processed object by a gas cluster ion beam based on the difference in a surface profile of the object to be processed and a target profile of the object to be processed and data of a sputtering depth corresponding to an irradiation dose amount of the gas cluster ion beam and for creating and polishing the profile of the surface of the processed object by changing the irradiation time of the gas cluster ion beam in accordance with the surface position of the processed object based on the calculated irradiation time.

The ultra precise polishing apparatus, which is one aspect of the present invention, comprises an irradiating device for irradiating a surface of an object to be processed with a gas cluster ion beam, a positioning device for changing a surface position of the object to be processed, which is irradiated with the gas cluster ion beam by moving the irradiating device and the object to be processed relative to each other, and a control device for controlling an irradiation time for which a surface position of the object to be processed is irradiated by the gas cluster ion beam.

The ultra precise polishing apparatus, which is another aspect of the present invention, comprises an irradiating device for irradiating a surface of an object to be processed by a gas cluster ion beam, a positioning device for changing a surface position of the object to be processed, which is irradiated by the gas cluster ion beam by moving the irradiating device and the object to be processed relative to each other, and a control device for calculating an irradiation time of a surface position of the object to be processed by the gas cluster ion beam based on the difference in a surface profile of the object to be processed and a target profile of the object to be processed and data of a sputtering depth with respect to an irradiation dose amount of the gas cluster ion beam, and for changing the irradiation time of the gas cluster ion beam in accordance with a surface position of the object to be processed by controlling the positioning device based on the calculated irradiation time.

BRIEF DESCRIPTION OF THE DRAWINGS

The present invention will be more apparent from the following detailed description when the accompanying drawings are referenced.

FIG. 6 is a graph plotting the irradiation dose amount;

DESCRIPTION OF THE PREFERRED EMBODIMENT

In the following description, details of the preferred embodiment of the present invention are explained with reference to the drawings. The elements common to each embodiment are correlated by assigning them the same numeral.

Embodiment 1

Figure 1:
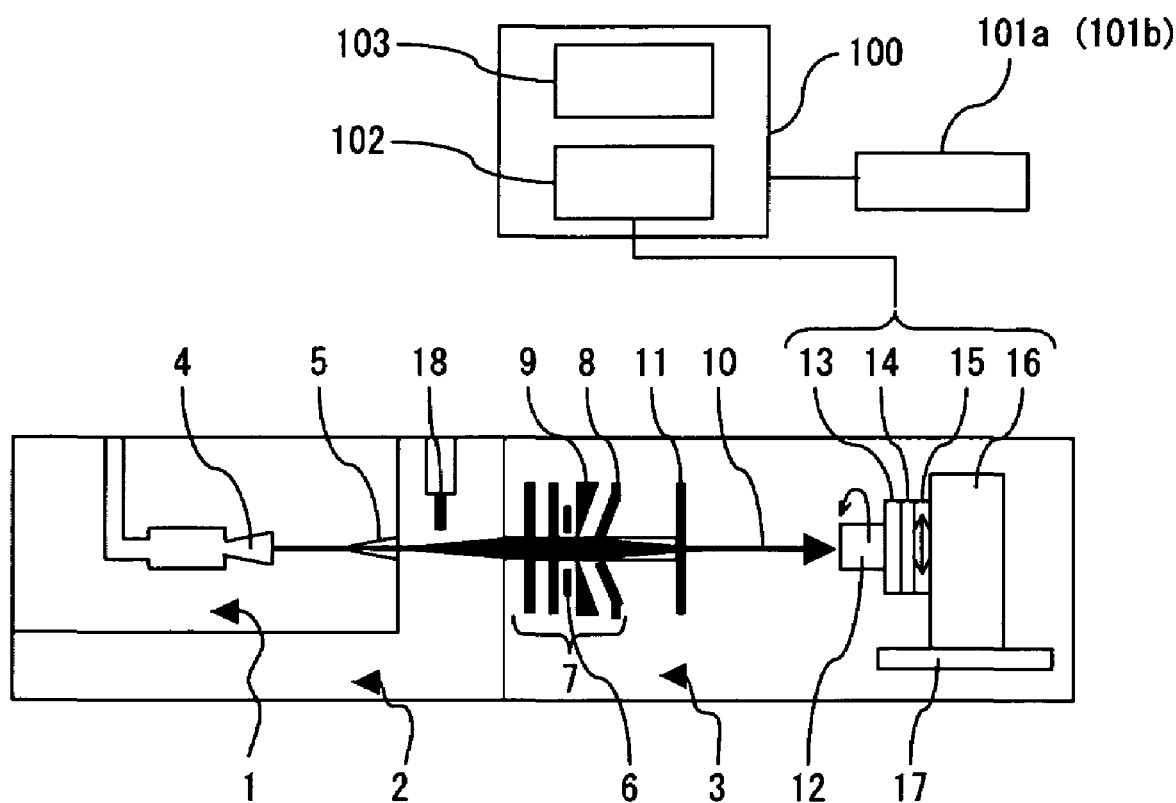
FIG. 1 is a cross-sectional diagram of a gas cluster ion beam processing device used for the embodiment of the present invention.

FIG. 1 describes a gas cluster ion beam processing device used for the ultra precise polishing of the present embodiment.

The gas cluster ion beam processing device comprises three chambers of a source unit 1, a differential pumping unit 2 and ionizing unit 3, and is connected to a control unit 100. Impurities such as gas, water, oxygen, nitrogen and others have to be removed from these chambers as completely as possible, as preparation before irradiation by an ion beam, and for that reason, the chambers are depressurized to an intended degree of vacuum by a pump which is not shown in the drawing.

In the source unit 1, a nozzle unit 4 and a skimmer 5 are provided. High-pressure gas of 0.6-1.0 MPa is supplied from a compressed gas cylinder, not shown in the drawing, to the nozzle 4. As the supplied gas, in addition to argon gas, oxygen gas, nitrogen gas, $SF_6$ (sulfur hexafluoride) gas and helium gas, for example, carbon dioxide gas or a gas in which two or more gases are mixed can be used. The gas cluster is generated by adiabatic expansion at an instant of ejection of the gas at supersonic speed from the nozzle 4. The generated gas cluster, next, passes the skimmer 5, and a beam diameter of the gas cluster is fixed.

A shutter 18 for switching a gas cluster beam 10 is provided in the differential pumping unit 2. The gas cluster beam 10 output from the source unit 1 is a neutral beam; however, when the beam enters the ionizing unit 3 via the differential pumping unit 2, it is ionized by electron bombardments using a tungsten filament 6 in the ionizing unit 3. For example, the nozzle 4 for generating the gas cluster and the tungsten filament 6 for ionizing by electron bombardments constitute an irradiation mechanism.

The gas cluster ion beam 10 is, next, accelerated by an accelerating electrode 7. The diameter of the gas cluster ion beam 10 in common use is from a few mm to tens of mm. It is possible to set optimal conditions for stably focusing the gas cluster ion beam 10 by changing the form of a ground electrode 8 and by changing the distance from a third electrode 9 to the ground electrode 8.

Moreover, an aperture 11 is provided downstream of these electrodes. The aperture 11 is for making an intended spot diameter of the gas cluster ion beam 10. This aperture 11 has a simple structure of a panel with a hole, and therefore, the spot diameter can be arbitrarily set with high precision within a range from tens of μm to tens of mm. Downstream of the aperture 11, a flat surface die 12 is arranged as a workpiece so that the surface of the flat surface die 12 is orthogonal to the injection direction of the gas cluster ion beam 10.

Figure 2:
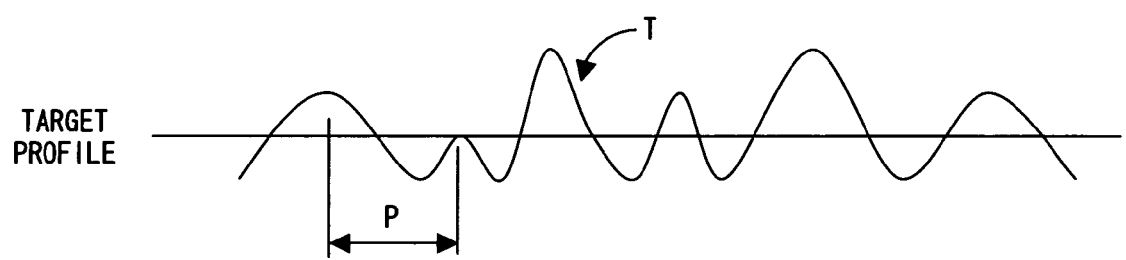
FIG. 2 is a graph showing the state of the surface of an object to be processed.

In the present embodiment, as shown in FIG. 2, the diameter of the gas cluster ion beam 10 is set smaller than the pitch P of convexity T (in units of millimeters) present on the surface of the flat surface die 12 to be processed.

The flat surface die 12 is mounted on a rotation stage 13, which is a slewing gear rotatable around an axis of rotation parallel to the incident direction of the gas cluster ion beam 10. The rotation stage 13 is mounted on an X-axis stage 14 movable in a front-rear direction with respect to the plane of the paper (an X-axis direction orthogonal to the axis of rotation of the rotation stage 13 (see FIG. 7)).

A servomotor or a stepper motor, not shown in the drawing, is mounted on the rotation stage 13 and the X-axis stage 14, and is controllable by the control unit 100, which is a controller. For example, the rotation stage 13 and X-axis stage 14 constitute a shifter.

A Y-axis stage 15 is mounted on the side of the X-axis stage 14. The position of the Y-axis stage 15 can be adjusted in a Y-axis direction orthogonal to each of the rotation axis of the rotation stage 13 and the X-axis of the X-axis stage 14. Therefore, by adjusting the Y-axis stage 15, it is possible to adjust the height position of the gas cluster ion beam 10. The Y-axis stage 15 can be fine adjusted manually by a screw, not shown in the drawing. Alternatively, the Y-axis stage 15 can be fine adjusted automatically by the servomotor or the stepper motor. The rotation stage 13, the X-axis stage 14 and the Y-axis stage 15 are mounted on a bracket 16, and the bracket 16 is fixed to a base 17.

The control unit 100 consists of a computer, for example, and comprises a calculation unit 102 and a storage unit 103. It is possible to create a control program to be executed in the control unit 100, and the control unit 100 can drive the rotation stage 13, the X-axis stage 14 and the Y-axis stage 15 in accordance with the created control program. An interferometer 101a or a profile measurement device 101b, both of which constitute a measurement device, measure the surface profile of the flat surface die 12, and transmit the data to the control unit 100.

Next, preparation required before the processing of the flat surface die 12 by the above devices is explained with reference to the drawings.

Figure 3:
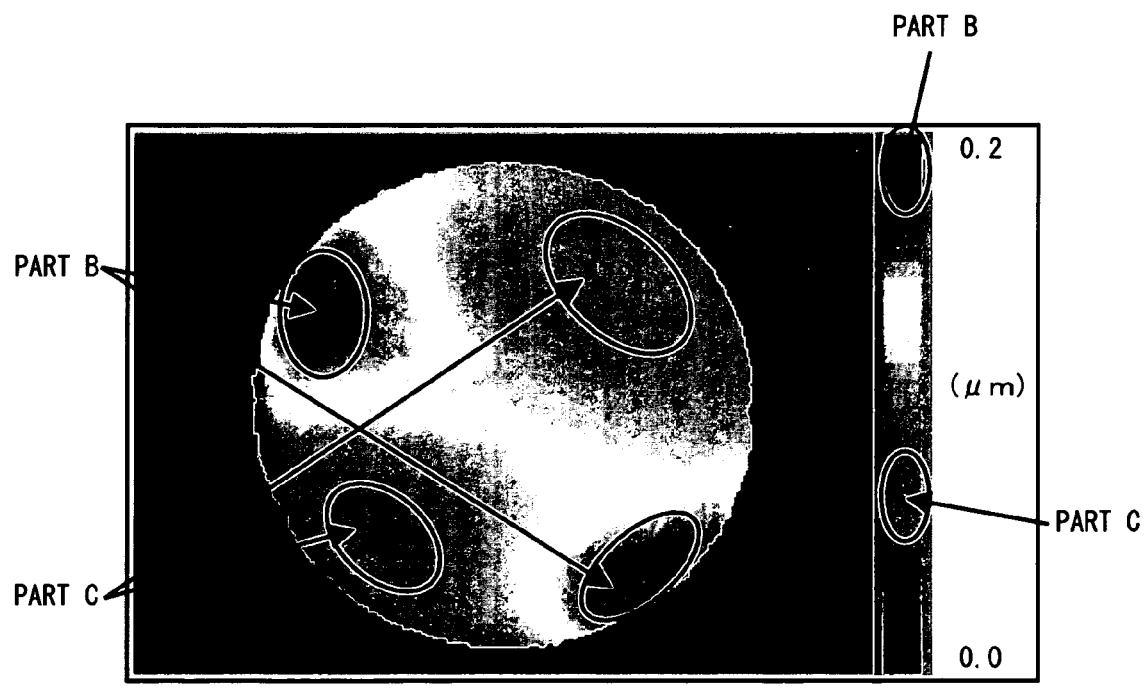
FIG. 3 is a cross-sectional diagram showing an example of the surface profile of an object to be processed measured by an interferometer.

First, for the rotationally axisymmetric flat surface die 12, the height of the projection of the surface over the whole surface of the flat surface die 12 to be processed is measured using the interferometer 101a. FIG. 3 shows an example of the measured height of projection. FIG. 3 indicates that a part B is higher than a part C. In the example of FIG. 3, the height measurement result of the part B is approximately 0.2 μm, the height measurement result of the part C is approximately 0.05 μm, and consequently, the difference between the part B and the part C is approximately 0.15 μm. A PV (Peak to Valley) value of the profile accuracy is approximately 0.15 μm. If this PV value can be reduced, the profile accuracy will be improved.

Figure 4:
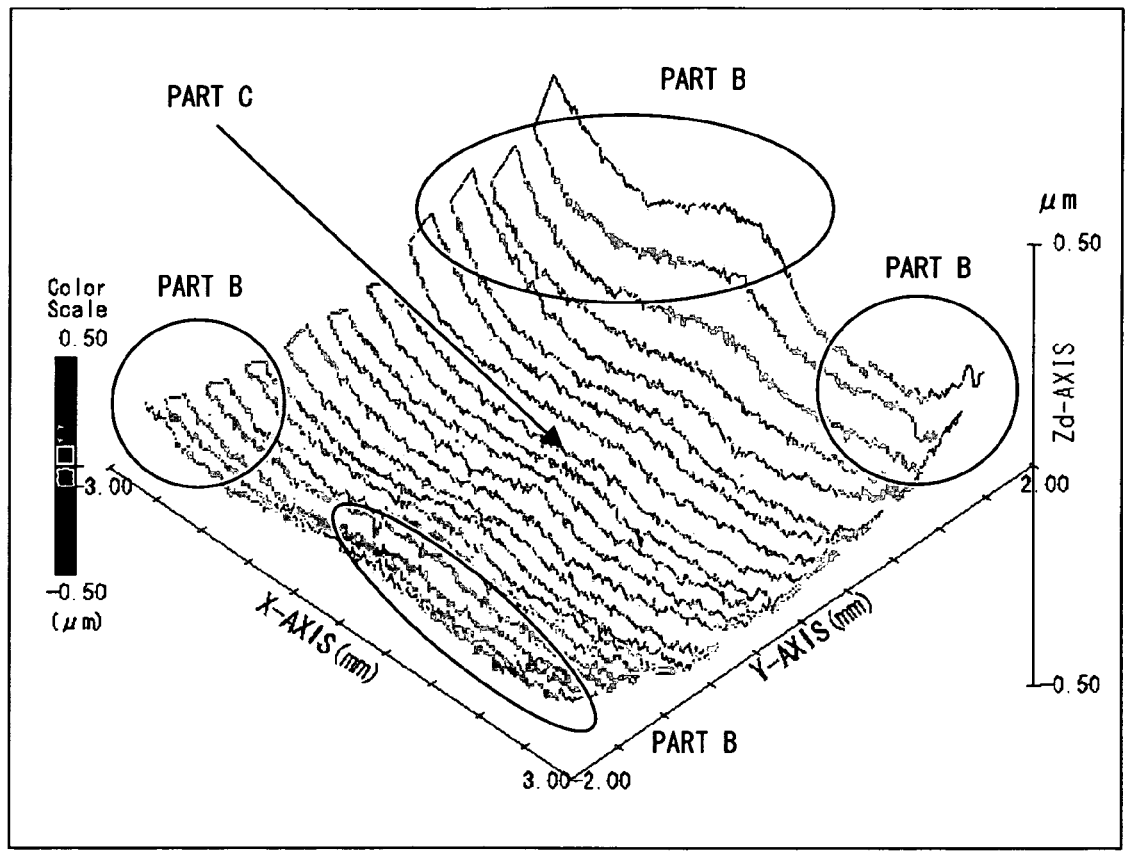
FIG. 4 shows an example of the height of projection measured by a profile measurement device.

Alternatively, for the rotationally nonaxisymmetric flat surface die 12, the height of the projection of the surface over the whole surface of the flat surface die 12 to be processed is measured using the profile measurement device 101b. FIG. 4 shows an example of the measured height of a projection peak, indicating that the part B is high and the part C is low. The height of the part B is approximately 0.2 μm, the height of the part C is approximately 0.05 μm, and consequently, the difference between the part B and the part C is approximately 0.15 μm. The profile accuracy has a PV (Peak to Valley) value of approximately 0.15 μm. If this PV value can be reduced, the profile accuracy will be improved.

At this point, a control program is created using a target profile stored in the storage unit 103 in advance and point sequence data of projection heights and projection positions obtained by the measurement result of the interferometer 101a or the profile measurement device 101b. From the measurement results, a horizontal cross-sectional area of a projection is revealed, and therefore, the spot diameter of the gas cluster ion beam 10 is set so as to be smaller than the area of the projection by selecting the aperture 11.

Next, reference positions of the gas cluster ion beam 10, in a state such that the irradiation position cannot be moved, and the flat surface die 12 are matched. At such a time, the height direction of the gas cluster ion beam 10 is adjusted by moving the Y-axis stage 15 by a manual operation or an automatic operation of the servomotor or the stepper motor. On the other hand, the horizontal direction of the gas cluster ion beam 10 can be adjusted by moving the X-axis stage 14 by driving the servomotor or the stepper motor, not shown in the drawing. For a setting method, an arbitrarily designated position is processed using a dummy flat surface die 12, and the reference position is set from a positional relation between the position of the trace of processing and the arbitrarily designated position.

Figure 5:
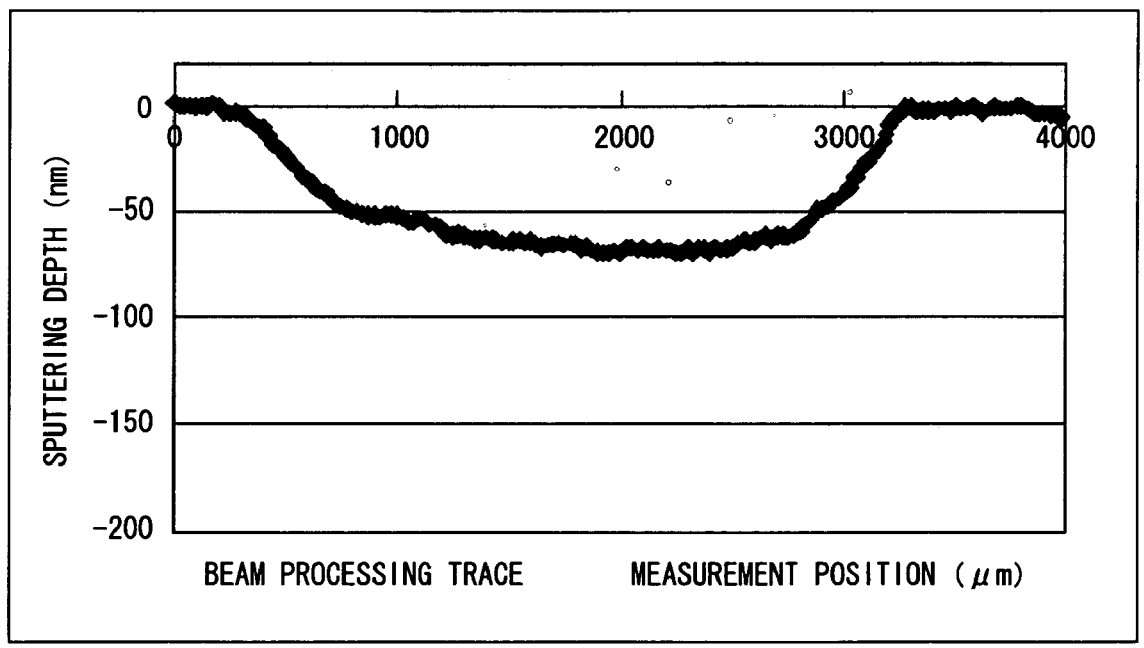
FIG. 5 is a graph showing a beam processing trace of the gas cluster ion beam irradiation.

An irradiation dose amount required to remove the projections is determined in advance as experimental data. FIG. 5 shows an example of the experimental data. FIG. 5 is a beam processing trace when the flat surface die 12 is fixed, the diameter of the aperture 11 is set to approximately 3000 μm, and a point is irradiated by the gas cluster ion beam 10 with the irradiation dose amount of $3 \times 10^{16}$ (ions/cm$^2$). This measurement can be obtained by a measuring instrument (Form Talysurf) for measuring the profile and surface roughness of a measurement target by scanning a probe in contact with the target. In FIG. 5, the horizontal axis is measurement position, and the vertical axis is sputtering depth at each measurement position.

This experiment is performed with the irradiation dose amount of $9 \times 10^{16}$ (ions/cm$^2$). FIG. 6 is a graph plotting the results of the experiment. From these results, it is confirmed that the sputtering depth is proportional to the irradiation dose amount. A feature of the gas cluster ion beam is that a large volume of atoms can be transported at low speed, and for that reason, the energy of the cluster is low, and a small amount of sputtering can be performed without damaging the surface. This enables fine control of the sputtering depth.

In the processing method of the present embodiment, the following equation is established.

Irradiation time=(irradiation dose amount×irradiation area×elementary charge $e$)/(amount of detected ion current)   (1)

Hence, in order to remove the projection height, the sputtering depth on the surface position of the flat surface die 12 is set, the irradiation dose amount at that time is calculated by the calculation unit 102 based on the graph of FIG. 6, the irradiation time is determined by assigning the calculated irradiation dose amount by the above equation (1), and then, the irradiation by the gas cluster ion beam is performed with the obtained irradiation dose amount and for the obtained irradiation time.

The actual conditions of a processing method for polishing the rotationally axisymmetric flat surface die 12 are explained. The X-axis stage 14 is moved so that a proximity to outer circumference of the flat surface die 12 can be irradiated by the gas cluster ion beam 10. Afterwards, the shutter 18 is opened, and the gas cluster ion beam 10 irradiates. Then, to create an intended profile of the flat surface die 12, the rotation stage 13 is rotated, the X-axis stage 14 is moved, and the gas cluster ion beam 10 irradiates. At such a time, as stated above, since the height and the position of the projection is known in advance, gas cluster ion beam 10 irradiation sufficient to remove the projection, is irradiated by the gas cluster ion beam 10.

Figure 7:
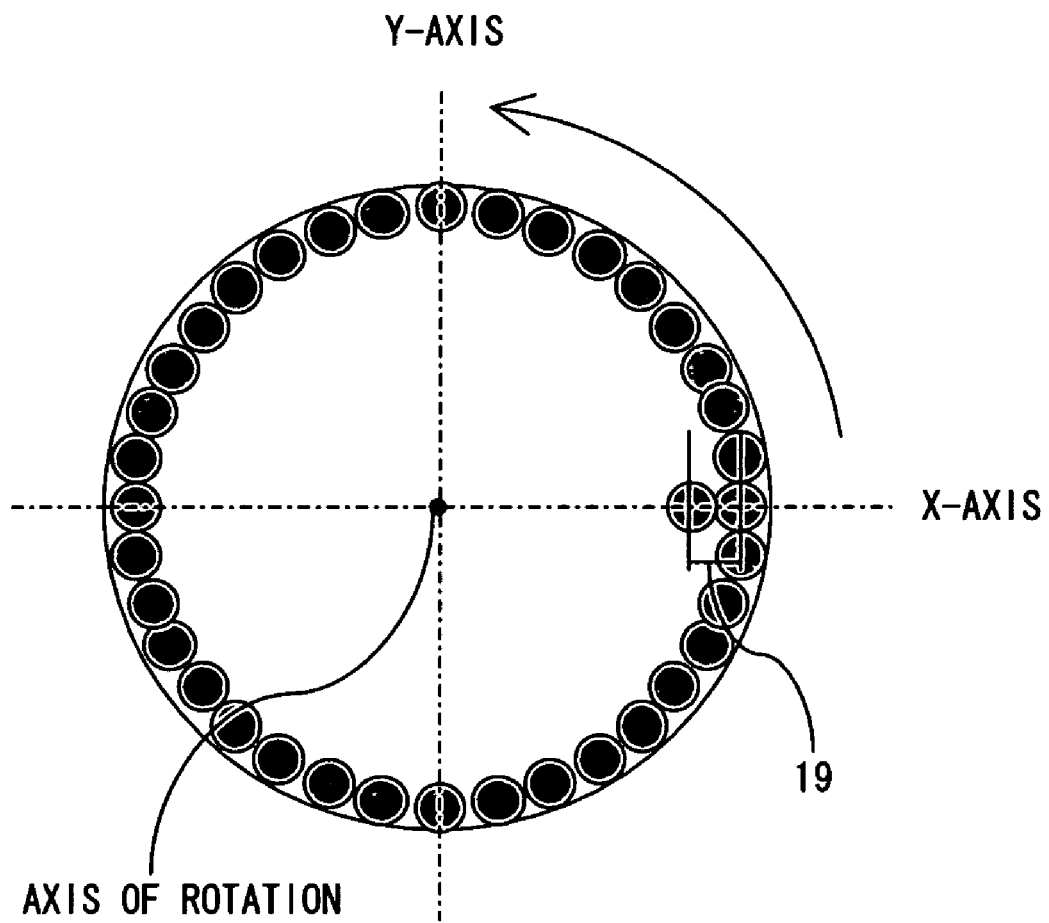
FIG. 7 is a front view explaining an example of irradiation of the object to be processed with the gas cluster ion beam.

FIG. 7 illustrates an irradiation method of the gas cluster ion beam 10. First, the outer circumference of the flat surface die 12 is irradiated with the gas cluster ion beam 10, by rotating the rotation stage 13. When the irradiation position reaches the projection position, by the control unit 100 performing a control for increasing the amount of removal of the projection by a low-speed rotation so as to overlap the beam processing trace, or a control for suspending the rotation, the irradiation duration is controlled, and an intended profile can be obtained with the projections being removed.

After the completion of the irradiation by the gas cluster ion beam 10 for one revolution of the rotation stage 13, the X-axis stage 14 is moved in the X-axis direction so that the gas cluster ion beam 10 irradiates further towards the center. In FIG. 7, the amount of movement is indicated as a movement pitch 19. The movement pitch 19 can be arbitrarily set. In the same way as above, the rotation stage 13 is controlled and rotated. By repeating this cycle, the profile creation of the whole surface of the flat surface die 12 can be achieved.

Figure 8:
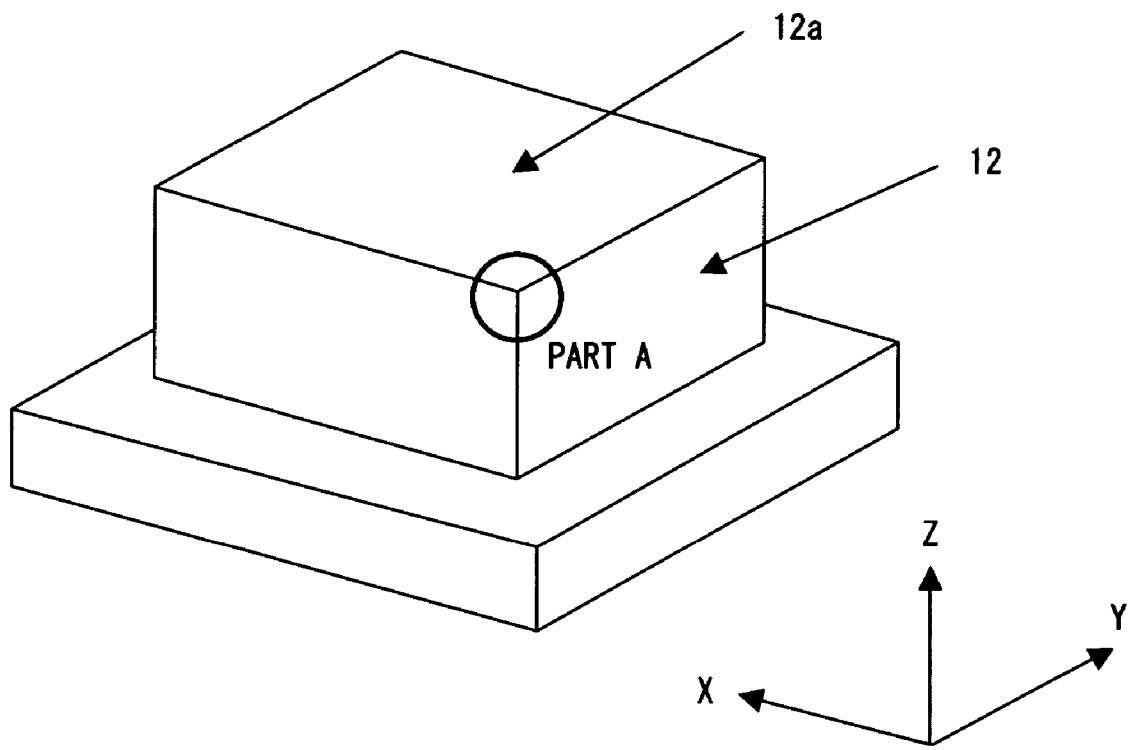
FIG. 8 is a perspective view of the flat molding die of the object to be processed.
Figure 9:
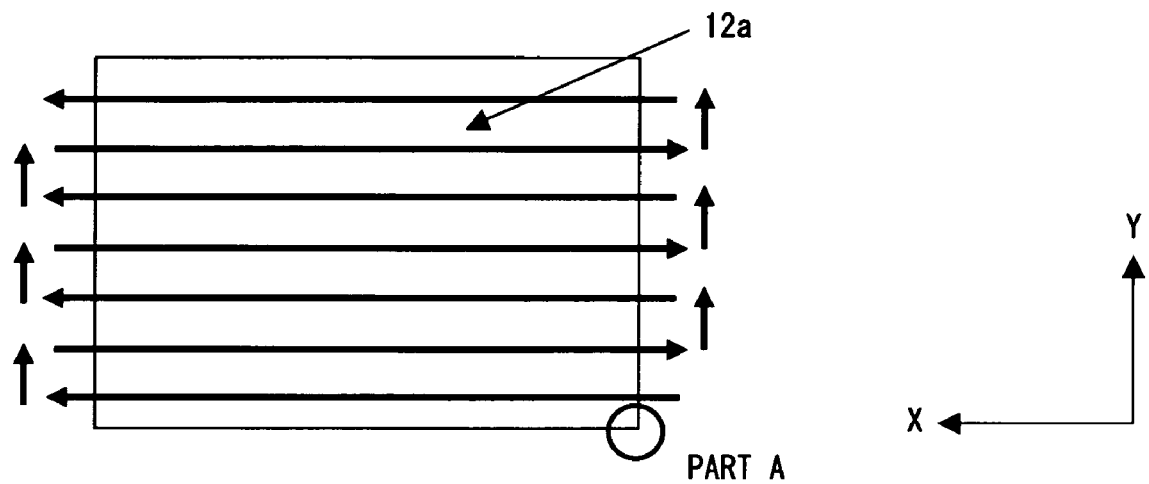
FIG. 9 is a top view of the flat molding die shown in FIG. 8.

The actual conditions of a processing method for polishing the rotationally nonaxisymmetric flat surface die 12 are explained with reference to FIG. 8 and FIG. 9.

The X-axis stage 14 and the Y-axis stage 15 are moved so that a proximity of a point A of the flat surface die 12 can be irradiated with the gas cluster ion beam 10. Afterwards, the shutter 18 is opened, and the gas cluster ion beam 10, irradiates. For profile creation of the flat surface die 12, the X-axis stage 14 is moved so that the gas cluster ion beam 10 can be scanned in a positive direction of the x-axis, and the gas cluster ion beam 10 irradiates. At that time, as stated above, since the height and the position of the projection is known in advance, a gas cluster ion beam 10 sufficient to remove the projection is set for the irradiation of the gas cluster ion beam 10. In other words, the overlap of the gas cluster ion beam 10 irradiation beam processing trace is controlled by changing the speed of the X-axis stage 14. Alternatively, the X-axis stage 14 may be suspended.

Next, when the X-axis direction is completed, the Y-axis stage 15 is moved so that the gas cluster ion beam 10 is scanned in a positive direction of the Y-axis. As shown in FIG. 9, this cycle is repeated so that the gas cluster ion beam 10 performs raster scanning of the surface of die 12a, and thus profile creation of the whole surface of the flat surface die 12 is achieved.

As explained above, according to the present embodiment, it is possible to improve the surface roughness of an infinitesimal area utilizing a processing principle of the gas cluster ion beam 10 in the process of profile creation. In other words, since a cluster is a state where atoms or molecules are loosely bound, when a cluster orthogonally collides with the flat surface die 12, which is the workpiece, the cluster scatters in all directions, and particles of the flat surface die 12 flicked away by the cluster are accumulated after scattering in the lateral direction. As a result, a lateral sputtering effect in the gas cluster ion beam processing, which allows improvement of the surface roughness, can be obtained.

According to the above embodiment, by processing of the gas cluster ion beam 10 based on the height and the position of the projections on the flat surface die 12 measured in advance, the projections can be removed selectively. For that reason, it is possible to improve the profile accuracy of the flat surface die 12. It is also possible to improve the surface roughness of an infinitesimal area by utilizing the processing principle of the gas cluster ion beam processing.

Embodiment 2

Figure 10:
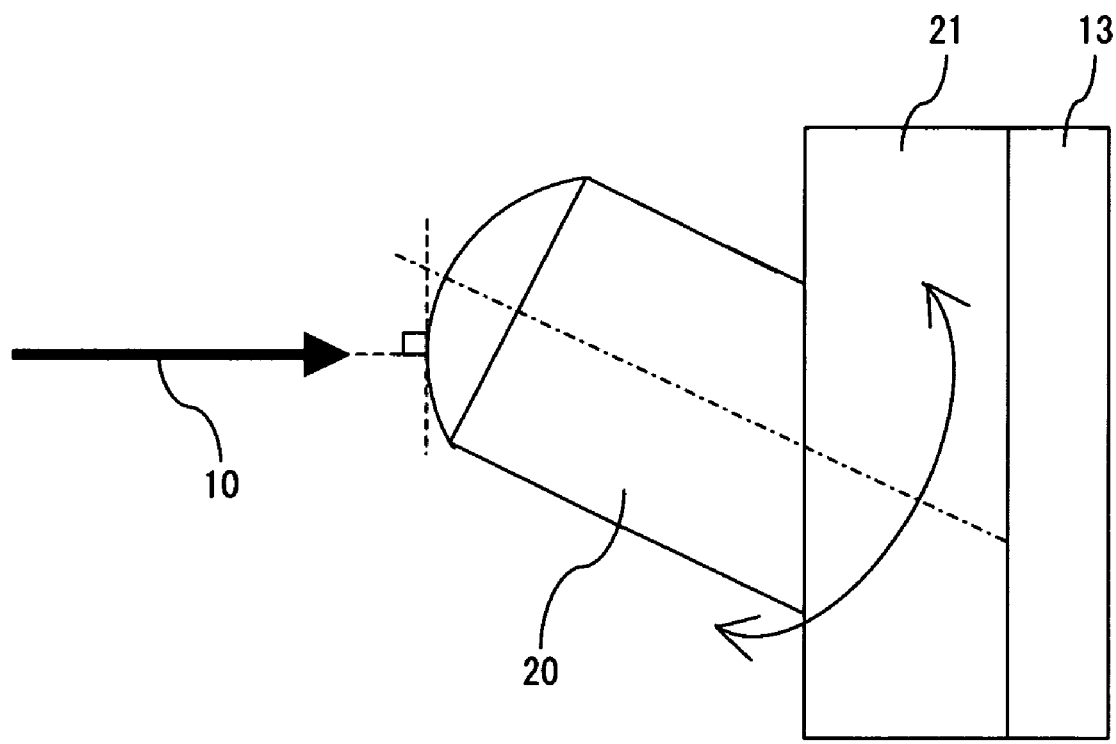
FIG. 10 is a side view showing the processing of the embodiment 2 of the present invention.
Figure 11:
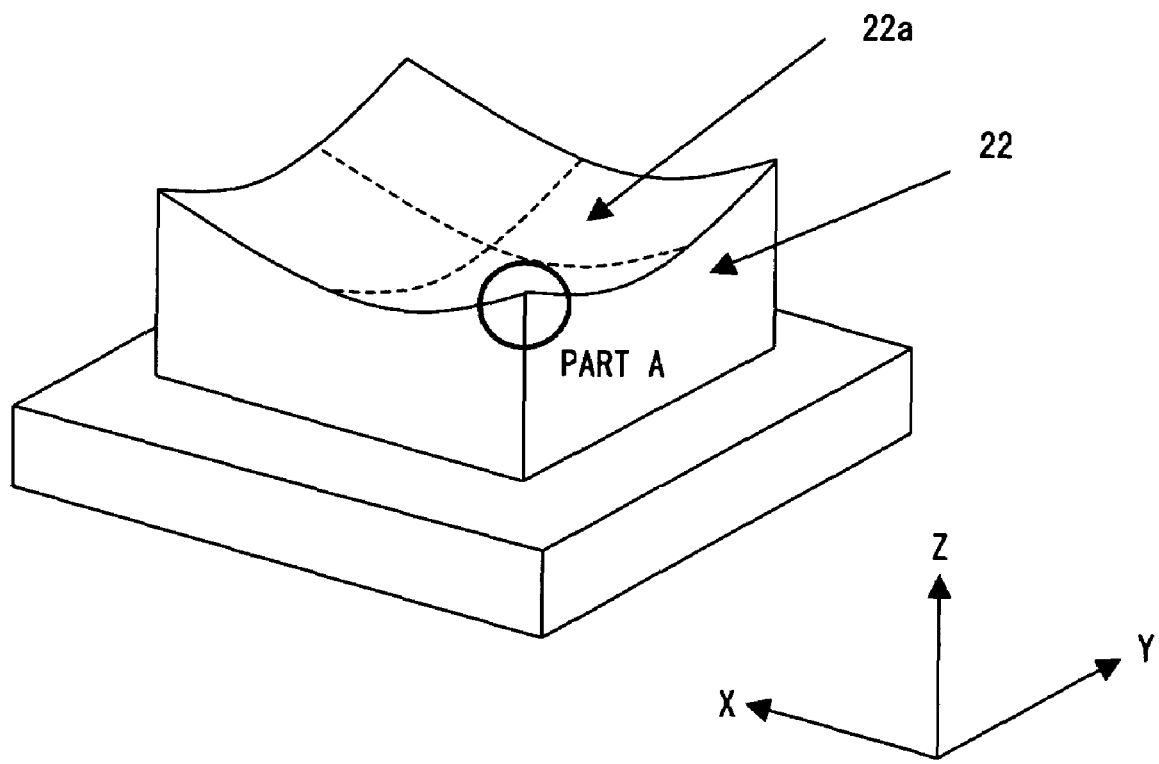
FIG. 11 is a perspective view of an adjustable surface die of the object to be processed.

FIG. 10 and FIG. 11 describe the embodiment 2 of the present invention. The present embodiment is to process a workpiece of a convex spherical surface die 20 or an arbitrarily-shaped die 22.

In order to constantly irradiate the surface of the spherical surface die 20 or the arbitrarily-shaped die 22 with the gas cluster ion beam 10, a swing stage 21, which is a swinging device, is provided on the rotation stage 13, and the spherical surface die 20 is held via the swing stage 21. The swing stage 21 comprises a control function such that it can be controlled in accordance with the surface profile of the spherical surface die 20.

In this embodiment, in order to ensure orthogonal irradiation of the surface profile of the spherical surface die 20 by the gas cluster ion beam 10, an inclination control of the swing stage 21 is performed. In a case of a rotationally axisymmetric die, while controlling the inclination, the profile is created by selectively removing the projections by irradiating the spherical surface die 20 with the gas cluster ion beam 10, rotating the rotation stage 13 and moving the X-axis stage 14, in the same way as the embodiment 1. In a case of a rotationally nonaxisymmetric die, the profile is created by selectively removing the projections by irradiating the arbitrarily-shaped die 22 with the gas cluster ion beam 10, while controlling the inclination and moving the X-axis stage 14 and the Y-axis stage 15.

In such an embodiment, in addition to an effect of the embodiment 1, by comprising the swing stage 21, it is possible to achieve an effect which enables the improvement of the profile accuracy and the surface roughness of the convex spherical surface die 20 and the arbitrarily-shaped die 22. According to the embodiment, processing of a concave in addition to a convex and processing of a non-spherical surface die in addition to a spherical surface die also become possible.

Although the present invention has been described with respect to a specific embodiment, it is not limited as such but is to be construed as embodying all modifications and improvements, which fall within the scope of the invention.

What is claimed is:

1. An ultra precise polishing method, comprising:

calculating an irradiation time of a surface position of an object to be processed by a gas cluster ion beam based on the difference in a surface profile of the object to be processed and a target profile of the object to be processed and data of a sputtering depth corresponding to an irradiation dose amount of the gas cluster ion beam; and creating and polishing the profile on the surface of the object to be processed by changing the irradiation time of the gas cluster ion beam in accordance with the surface position of the object to be processed based on the calculated irradiation time, wherein an incident direction of the gas cluster ion beam is constantly kept orthogonal to the surface of the object to be processed by swinging an irradiating device of the gas cluster ion beam and the object to be processed relative to each other.

2. An ultra precise polishing apparatus, comprising:

an irradiating device for irradiating a surface of an object to be processed by a gas cluster ion beam;

a positioning device for changing a surface position of the object to be processed, which is irradiated by the gas cluster ion beam by moving the irradiating device and the object to be processed relative to each other; and a control device for calculating an irradiation time of a surface position of the object to be processed by the gas cluster ion beam based on the difference in a surface profile of the object to be processed and a target profile of the object to be processed and data of a sputtering depth with respect to an irradiation dose amount of the gas cluster ion beam, and for changing the irradiation time of the gas cluster ion beam in accordance with a surface position of the object to be processed by controlling the positioning device based on the calculated irradiation time, further comprising:

a swinging device for swinging the irradiating device and the object to be processed relative to each other, and for constantly keeping an incident direction of the gas cluster ion beam from the irradiating device orthogonal to a surface of the object to be processed.

* * * * *